US009417294B2

(12) United States Patent
Law et al.

(10) Patent No.: US 9,417,294 B2
(45) Date of Patent: Aug. 16, 2016

(54) CURRENT SENSORS USING MAGNETOSTRICTIVE MATERIAL

(71) Applicant: UWM Research Foundation, Inc., Milwaukee, WI (US)

(72) Inventors: Chiu Tai Law, Glendale, WI (US); Rani El-Hajjar, Whitefish Bay, WI (US)

(73) Assignee: UWM Research Foundation, Inc., Milwaukee, WI (US)

( * ) Notice: Subject to any disclaimer, the term of this patent is extended or adjusted under 35 U.S.C. 154(b) by 157 days.

(21) Appl. No.: 14/079,889

(22) Filed: Nov. 14, 2013

(65) Prior Publication Data

US 2014/0132256 A1 May 15, 2014

Related U.S. Application Data

(60) Provisional application No. 61/726,204, filed on Nov. 14, 2012.

(51) Int. Cl.
*G01R 33/032* (2006.01)
(52) U.S. Cl.
CPC .................................. *G01R 33/0327* (2013.01)
(58) Field of Classification Search
USPC .................... 324/207.21, 244, 244.1, 253; 250/227.17
See application file for complete search history.

(56) References Cited

U.S. PATENT DOCUMENTS

| | | | | |
|---|---|---|---|---|
| 4,106,028 A | * | 8/1978 | Jeffers et al. | 346/74.6 |
| 4,376,248 A | * | 3/1983 | Giallorenzi et al. | 250/227.19 |
| 4,378,497 A | * | 3/1983 | Giallorenzi | 250/227.19 |
| 4,442,350 A | * | 4/1984 | Rashleigh | 250/227.17 |
| 4,622,460 A | * | 11/1986 | Failes et al. | 250/227.19 |
| 5,095,514 A | | 3/1992 | Curtis | |
| 5,437,197 A | | 8/1995 | Uras et al. | |
| 5,723,870 A | * | 3/1998 | Crowne et al. | 250/577 |
| 5,812,711 A | * | 9/1998 | Glass | G02B 6/022 385/12 |
| 6,122,421 A | * | 9/2000 | Adams et al. | 385/37 |
| 6,330,383 B1 | * | 12/2001 | Cai | G02B 6/02085 385/37 |
| 6,400,869 B2 | * | 6/2002 | Pan | G02B 6/0208 385/10 |
| 6,453,093 B2 | * | 9/2002 | Xie | G02B 6/29317 385/122 |
| 8,098,967 B1 | | 1/2012 | Bazzone | |
| 8,354,842 B2 | * | 1/2013 | Kim et al. | 324/240 |
| 8,907,665 B2 | * | 12/2014 | Rose et al. | 324/240 |
| 2004/0234200 A1 | * | 11/2004 | Jennings | G02B 6/0218 385/37 |
| 2005/0134253 A1 | * | 6/2005 | Kovanko et al. | 324/96 |
| 2009/0129721 A1 | * | 5/2009 | Chen | G01F 23/292 385/12 |
| 2012/0032674 A1 | * | 2/2012 | Rajula et al. | 324/253 |
| 2012/0086443 A1 | * | 4/2012 | Bazzone | 324/244.1 |
| 2013/0027030 A1 | * | 1/2013 | Twerdochlib et al. | 324/244.1 |
| 2013/0169267 A1 | * | 7/2013 | Miyakoshi et al. | 324/117 R |

OTHER PUBLICATIONS

Altin, G. et al., "Static Properties of Crystallographically Aligned Terfenol-D/polymer Composites," Journal of Appl. Phys., vol. 101, 0333537 (2007).

(Continued)

*Primary Examiner* — Jermele M Hollington
*Assistant Examiner* — Douglas X Rodriguez
(74) *Attorney, Agent, or Firm* — Michael Best & Friedrich LLP

(57) ABSTRACT

A current sensor device. The current sensor device includes a strain distribution converter; an optical fiber coupled with the strain distribution converter; and a magnetostrictive material associated with the strain distribution converter such that a change in shape of the magnetostrictive material causes a change in length of the optical fiber.

27 Claims, 14 Drawing Sheets

(56) References Cited

OTHER PUBLICATIONS

Chiang, K.G. et al., "Temperature-compensated fiber-Bragg-grating-based magnetostrictive current sensor for dc and ac currents," Opt. Eng. 42, 1906-1909 (2003).
Dziuda, L. et al., "Laboratory Evaluation of the Hybrid Fiber-Optic Current Sensor," Sensors and Actuators A: Physical, vol. 136, pp. 184-190 (2007).
El-Hajjar, R. et al., "Adhesive Polyvinyl Chloride Coatings for Quantitative Strain Measurement in Composite Materials," Composites Part B, 2011. vol. 42, pp. 1929-1936 (2011).
Erdogan, T., "Fiber Grating Spectra," J. Lightw. Technol. 15,1277-1294 (1997).
Hudson, J. et al., "Magnetomechanical Properties of Epoxy-bonded Terfenol-D Composites," Ferroelectrics., vol. 228, pp. 283-295 (1999).
Jin, L. et. al., "An Embedded FBG Sensor for Simultaneous Measurement of Stress and Temperature," IEEE Photon. Technol. Lett., vol. 18, pp. 154-156 (2005).
Lanza, G. et al., "Effect of the anisotropic magnetostriction on Terfenol-D based fiber Bragg grating magnetic sensors," Sensors and Actuators A: Physical, vol. 172, pp. 420-427 (2011).
Law, C.T. et al., "Fiber-Optics-Based Fault Detection in Power Systems," IEEE Trans. Power Delivery, vol. 23, pp. 1271-1279 (2008).
Liu, H. et al., "Magnetostrictive Composite-fiber Bragg grating (MC-FBG) Magnetic Field Sensor," Sensor and Actuators A: Physical, vol. 173, pp. 122-126 (2012).
Lo, C.Y. et al., "Large Magnetostriction in Epoxy-bonded Terfenol-D Continuous-fiber Composite with Crystallographic Orientation," IEEE Trans. Magnetics., vol. 42, pp. 3111-3113 (2006).
Mora, J. et. al., "A Magnetostrictive Sensor Interrogated by Fiber Gratings for DC-Current and Temperature Discrimination," IEEE Photon.Technol. Lett., vol. 12, pp. 1680-1682 (2000).
Nersessian, N. et al., "Magneto-thermo-mechanical Characterization of 1-3 Type Polymer-Bonded Terfenol-D Composites," Journal of Magnetism and Magnetic Materials, vol. , pp. (2003).
Ning, Y.N. et. al., "Recent Progress in Optical Current Sensing Techniques," Rev. Sci. Instrum., vol. 66, pp. 3097-3111 (1995).
Or, S.W. et al., "Dynamic Magnetomechanical Behavior of Terfenol-D/epoxy 1-3 Particulate Composites," IEEE Trans. Magnetics, vol. 40, pp. 71-77 (2004).
Or, S.W. et al., "Dynamic Magnetomechanical Properties of Terfenol-D/epoxy Pseudo 1-3 Composites," Journal of Appl. Phys., vol. 97, 10M308 (2005).
Prabhugoud, M. et al., "Modified Transfer Matrix Formulation for Bragg Grating Strain Sensors," J. Lightw. Technol. 22, 2302-2309 (2004).
Reilly, D. et al., "A Fiber-Bragg-Based Sensor for Simultaneous AC Current and Temperature Measurement," IEEE Sensors Journal, vol. 6, pp. 1539-1542 (2006).
Satpathi, D. et al., "Design of a Terfenol-D Based Fiber-optic Current Transducer," IEEE Sensors Journal, vol. 5, pp. 1057-1065 (2005).
Smith, A.M., "Birefringence Induced by Bends and Twists in Single-Mode Optical Fibers," Applied Optics, vol. 15, pp. 2606-2608 (1980).
Yariv, A. et al., "Proposal for Detection of Magnetic Fields through Magnetostrictive Perturbation of Optical Fibers," Opt. Lett., vol. 5, pp. 87-89 (1980).
Yi, B. et al., "Temperature Compensation for a fiber-Bragg-grating-based magnetostrictive sensor," Microwave and Optical Technology Letters, vol. 36, pp. 211-213 (2003).

\* cited by examiner $$H(d^{-1}) = p_1 d^{-1} + p_2$$

CURRENT SENSORS USING MAGNETOSTRICTIVE MATERIAL

CROSS-REFERENCE TO RELATED APPLICATIONS

This application claims priority to U.S. Provisional Patent Application No. 61/726,204 filed Nov. 14, 2012, the content of which is incorporated herein by reference in its entirety.

BACKGROUND

The present invention relates to current sensors which use magnetostrictive material.

Known current sensors suffer from a number of drawbacks, including sensitivity to electromagnetic interference (EMI), bulky design, and slow response time.

SUMMARY

Accordingly, improved current sensor designs are disclosed herein.

In one embodiment, the invention provides a current sensor device. The current sensor device includes a strain distribution converter; an optical fiber coupled with the strain distribution converter; and a magnetostrictive material associated with the strain distribution converter such that a change in shape of the magnetostrictive material causes a change in length of the optical fiber.

In another embodiment the invention provides a current sensor device. The current sensor device includes a strain distribution converter and a magnetostrictive material associated with the strain distribution converter such that a change in shape of the magnetostrictive material causes a change in shape of the strain distribution converter.

Other aspects of the invention will become apparent by consideration of the detailed description and accompanying drawings.

BRIEF DESCRIPTION OF THE DRAWINGS

FIG. 3b shows directions of expansion and contraction of a current sensor in a transverse orientation relative to the easy axis of a magnetic field as in FIG. 3a.

DETAILED DESCRIPTION

Figure 1:
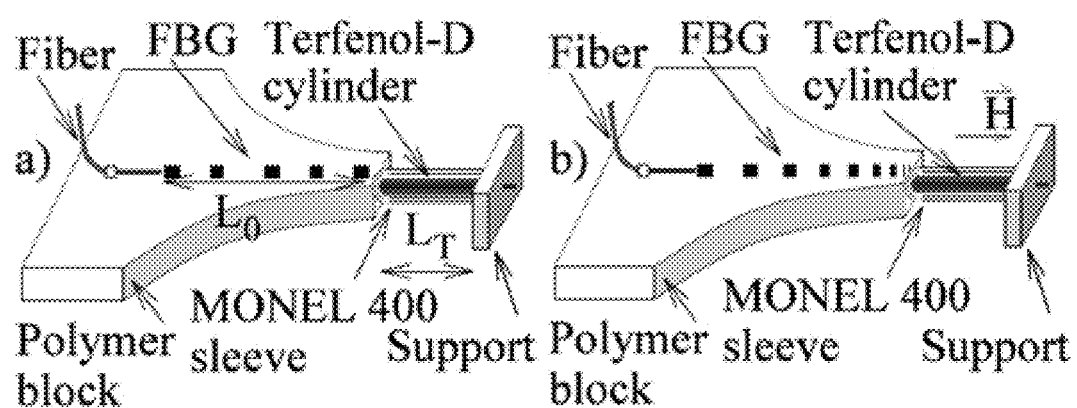
FIG. 1(a) shows a chirped fiber optic current sensor (FOCS) in the absence of a magnetic field (H=0) and FIG. 1(b) shows a chirped FOCS in the presence of a magnetic field (H≠0).

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

In various embodiments the invention includes various types of current sensors including, in certain embodiments, fiber optic-based current sensor (FOCS) devices. The devices may be envisioned in various embodiments, with two specific embodiments provided but not limiting the scope of the invention. The current sensors measure the current from an adjacent conductor based on a correlation between the current flowing through the conductor and the signal response of the current sensor device.

The current sensors may also be described as having an output optical power proportional to the magnitude of the magnetic field in which the sensor is placed. Since a current-carrying conductor generates a magnetic field, the current magnitude may be inferred based on measurements of the magnetic field adjacent the conductor.

Accordingly, the current sensors disclosed herein are based on deformation of a strain distribution converter by a magnetostrictive material when the current sensors are placed in a magnetic field. Disclosed herein are several methods for quantifying the deformation of the strain distribution converter, which can then be used to quantify the current magnitude.

In some embodiments, the strain distribution converter deforms in a non-linear fashion along its length in the presence of a magnetic field. In some embodiments, the non-linear deformation is a result of the strain distribution converter having a variable (e.g. tapered) cross-sectional area along its length. In other embodiments, there is a gradation of magnetostrictive material along the length of the strain distribution converter, which leads to the non-linear deformation. In these embodiments, regions of the strain distribution converter having larger amounts of magnetostrictive material deform to a larger degree than regions having smaller amounts of magnetostrictive material.

In certain embodiments, deformation of the strain distribution converter is measured optically. In embodiments such as these, the current sensor includes an optical fiber coupled with a fiber Bragg grating (FBG) along with the strain distribution converter and the magnetostrictive material. In one embodiment the FBG is one of a number of known types of optical gratings that may be coupled with (e.g. embedded in) the strain distribution converter. In particular embodiments the FBG is a fiber optic having a long axis. In general, suitable design of the strain distribution converter leads to a non-linear response in which the FBG period is regulated, effectively converting a uniform FBG into a chirped FBG. As magnetic field magnitude increases, the output optical signal is increasingly frequency chirped, i.e. bandwidth-widened.

In particular embodiments, the tapered section of the polymer has a width given by the formula $w(z)=w_0/(1+k\,z)$, where $w_0$ is the maximum polymer width, k is a parameter with units of inverse distance, and z is the axial coordinate with origin at the wider end of the polymer block. In this case, the transducer force applied to the small cross sectional end will incur less strain on the FBG as z decreases. With careful control and accurate transfer of the SD on the FBG, the FBG period will be regulated accordingly. As H increases, an FBG with uniform period (see FIG. 1a) is transformed into a non-uniform one (see FIG. 1b).

In those embodiments which include an FBG and in which the strain distribution converter has a variable cross-sectional area along its length, the cross-sectional area of the strain distribution converter orthogonal to the FBG may vary non-linearly along the axis of the FBG. In certain embodiments, the magnetostrictive material may include an elongated element (e.g. a rod) that abuts the strain distribution converter at one end, for example at the location where the fiber optic exits the strain distribution converter (FIG. 1a). In general, this may also be the end of the strain distribution converter having the smallest cross-sectional area. The opposite end of the strain distribution converter and the opposite end of the magnetostrictive element are held fixed. Thus, when the magnetostrictive material changes length it causes changes in the shape of the strain distribution converter. If the strain distribution converter expands due to an increase in magnetic field strength (FIG. 1b), this leads to compression of the strain distribution converter. As a result of the non-linear (e.g. tapered) shape of the strain distribution converter, the compression would be non-linear, with greater amounts of compression occurring in the regions having a smaller cross-sectional area. Given that the FBG is coupled to the strain distribution converter, changes in shape of the strain distribution converter cause changes in shape of the FBG. Since the changes in shape of the strain distribution converter are non-linear, this causes non-linear changes in the FBG such that the uniform FBG response is converted to a chirped FBG response.

In another embodiment, the major components include an FBG, a magnetostrictive element (e.g. a Terfenol-D composite material), a strain distribution convertor (e.g. a polymer with varying cross section area along FOCS axis), and a temperature compensation material (e.g. MONEL 400) (FIGS. 1a, 1b). In this embodiment, the magnetostrictive element is supported by a sleeve made of the temperature compensation material; the temperature compensation material is chosen so that it has the same coefficient of thermal expansion as the magnetostrictive material. As above, using suitable materials and shapes the FBG period may be regulated, effectively converting a uniform FBG into a chirped FBG. As the magnetic field magnitude increases, the output optical signal is increasingly frequency-chirped, i.e. bandwidth-widened. The rise in bandwidth translates into increases in return power. In this embodiment the FBG is embedded inside a block of polymer (which acts as the strain distribution converter), allowing the FBG to sense the strain distribution inside the polymer. Owing to the fact that the cross sectional area of the polymer is a function of axial distance (z) from the small cross sectional end, a force applied to the small cross sectional end will cause less strain/compression on the FBG as z increases.

With careful control and accurate transfer of the strain distribution on the FBG, the FBG period can be regulated accordingly and the FBG assumes a chirped profile. In this embodiment, a thermally compensated Terfenol-D transducer is used to stress the force sensor. The transducer may include a MONEL 400 sleeve (pipe) and a Terfenol-D cylinder. The MONEL 400 sleeve thermally expands along with Terfenol-D cylinder since the two materials have the same thermal expansion coefficient. The cylinder and sleeve may be attached to a rigid and thermally stable support (such as a carbon-fiber composite) at one end while the other end of the sleeve will be adhered to the strain distribution converter. As a result, the cylinder will push the force sensor when there is a magnetic field along the z axis in a manner that is independent of temperature changes. To enable optimal transfer of strain to the FBG, the transducer is placed as close as possible to the FBG. This may be achieved by drilling a hole through the Terfenol-D cylinder to channel the optical fiber through the transducer. For easy machining and fast transducer response, a Terfenol-D composite (discussed further below) may be used to fabricate the cylinder with another appropriate material, such as MONEL 400 composite, that has the same thermal expansion coefficient.

Figure 2:
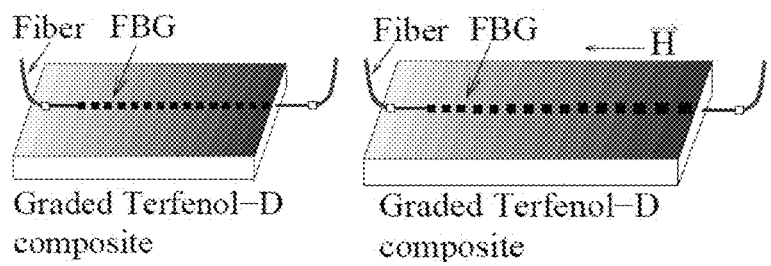
FIG. 2 shows an embodiment of a current sensor including a fiber Bragg grating (FBG) associated with a magnetostrictive composite material in which the FBG is oriented parallel to the magnetic field, shown when the magnetic field is zero (left) or the magnetic field is nonzero (right).

In other embodiments, a 'chirped' FOCS can be further simplified if it is fabricated from a composite having a gradation of magnetostrictive material (such as Terfenol-D) from one end to the other. In one embodiment, the current sensor may be simplified to a graded composite of magnetostrictive material plus an FBG. FIG. 2 shows a graded composite of magnetostrictive material in the absence (left) or presence (right) of a magnetic field.

In various embodiments, the magnetostrictive material may include Terfenol-D, Galfenol, or Metglas. Particles of Terfenol-D may be used in sizes ranging from 20 to 300 microns in diameter and elongated particles up to 1 mm in length may also be used. The magnetostrictive material is embedded in the strain distribution converter material, e.g. a polymer. The graded composite may include larger particles and/or a higher volume fraction of magnetostrictive materials at one end and smaller particles and/or a lower volume fraction at the other end. Graded composites are discussed further below.

When placed in a magnetic field the graded composite material undergoes a non-linear shape change, with the regions having a higher volume fraction and/or larger particle size experiencing a greater shape change than the regions having a lower volume fraction and/or smaller particle size. Since strain scales up with the higher volume fraction region, the region with higher volume fraction has higher strain. In various embodiments, the FBG is embedded inside the graded magnetostrictive composite and the composite material is disposed adjacent to a magnetic field such that the gradient of magnetostrictive material and the FBG are parallel to the magnetic field (FIG. 2). When the strain is transferred fully to the FBG, an initially uniform FBG under zero magnetic field (FIG. 2, left) is transformed into a chirped FBG when the magnetic field is nonzero (FIG. 2, right), resulting a similar response function as the embodiment having a tapered strain distribution converter. However, unlike the embodiment having the tapered strain distribution converter, in the present embodiment which uses a graded magnetostrictive composite the graded composite functions as a transducer as well as a strain converter and does not require thermal compensation.

Figure 3A:
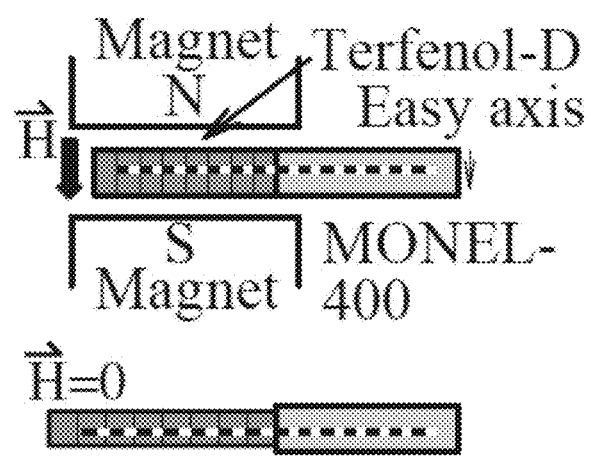
FIG. 3a shows another embodiment of a current sensor including an FBG associated with a magnetostrictive composite material in which the FBG is oriented perpendicular to the magnetic field in an air gap of a magnetic core.
Figure 3B:
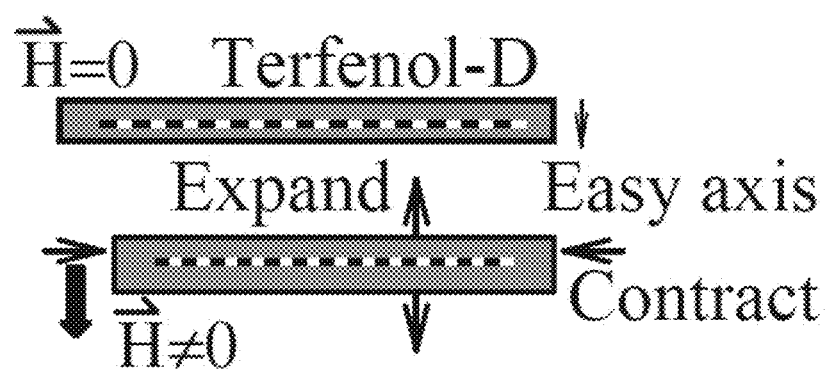

In yet another embodiment, a current sensor having a graded magnetostrictive composite with an embedded FBG is disposed within the air gap of a magnetic core and is oriented with the magnetic field perpendicular to the direction of the gradient of magnetostrictive material and to the FBG axis (FIG. 3a). In this embodiment the FBG is not oriented parallel to the easy axis of the magnetic field composite, but instead is oriented orthogonal to the easy axis of the composite (FIG. 3b). Without being limited as to theory, it appears that the Poisson relationship between the easy axis and an orthogonal or a transverse axis facilitates the function of this embodiment. In this embodiment it is counterintuitive to use a transverse configuration, since typical metals have a ratio of transverse strain magnitude to longitudinal strain of 30%, resulting in a significant decrease in sensor sensitivity. Preliminary results with digital image correlation indicate that the ratio for monolithic Terfenol-D is 60%, while its value for Terfenol-D composite is 46%. Such reduction in strain translates into a slight decrease in sensitivity of the transverse FOCS. On the other hand, the transverse FOCS orientation experiences an increased concentration of the magnetic field which can make up for some or all of the decrease in sensitivity. Additional sensitivity can be provided by increasing the concentration of the magnetic field with a magnetic core.

This latter embodiment permits the use of a magnetostrictive material having a smaller dimension in the magnetic field direction and hence allows easy integration with a magnetic core and permits a decrease in the air gap to enhance sensitivity. Since the field enhancement from a magnetic core scales up drastically as its air gap decreases, the transverse FOCS can become highly sensitive with a sufficiently small air gap. Moreover, the transverse configuration enables simple fabrication without tedious fine tuning. For example, the uniform FOCS (embodiment of FIG. 4a, 4b) requires a dedicated balance of strains on the portions of FBG over Terfenol-D and MONEL-400 to achieve a minimum output at zero magnetic field by tuning the three mounting points. In contrast, a transverse FOCS only requires attaching the FBG to Terfenol-D and MONEL-400 or magnetostrictive composite under a high magnetic field. The procedure provides flexibility in choosing the maximum operating current and improving the sensitivity at low magnetic field. The transverse FOCS output is high with low magnetic fields and vice versa. Additionally, the difficulty in fabricating graded Terfenol-D composite can be greatly alleviated with self-assembly schemes for transverse FOCS. For instance, graded Terfenol-D composites can be easily generated by aligning Terfenol-D particles with a magnetic field H while controlling volume fraction with the assistance of gravity (discussed below).

While many of the embodiments disclosed herein refer to the use of Terfenol-D as the magnetostrictive material, those skilled in the art will understand that other such materials may be used along with, or in place of, Terfenol-D, including Galfenol, Metglas, or other suitable magnetostrictive materials. Terfenol-D (chemical formula: $Tb_xDy_{1-x}Fe_2$ (x~0.3)) is particularly suitable as it is a giant magnetostrictive material with high energy density and the highest magnetostriction of any alloy. Terfenol-D expands and contracts as a function of magnetic field strength.

In various embodiments, the disclosed current sensors may be used as part of a network of optical sensors for coordinating power system protection, detecting and locating power system faults, as disclosed in Law et al. (C. T. Law, K. Bhattari and D. C. Yu, "Fiber-Optics-Based Fault Detection in Power Systems," IEEE Trans. Power Delivery, vol. 23, pp. 1271-1279, 2008; incorporated herein by reference in its entirety). In various embodiments the FOCS can be connected in series by connecting the proximal end of a first sensor to a light source such as a superluminous light emitting diode (SLED) and the distal end of the first sensor to a second sensor, etc. (e.g. see diagrams in FIGS. 1a, 1b, 2; see also Law et al.). This type of sensor network can be extremely effective in enhancing power system reliability. FOCSs are immune to EMI and have a compact design in comparison to those of the conventional sensors, such as iron-core current transformers, and are suitable for detecting current surges and current direction associated with line faults. For successful interface with an optical sensor network, FOCS convert electrical disturbances into distinctive optical signals for easy detection at a low cost of implementation and maintenance.

The magnetostrictive-based FOCSs are cost effective and have a more pronounced response than those of Faraday-effect based FOCSs. The cost and complexity of installing a FOCS network can be further reduced by integrating a fiber Bragg grating (FBG), which also enables easier multiplexing of fault signals in a network of FOCSs. The FBG translates the strain variation induced by a magnetostrictive (e.g. Terfenol-D) transducer to a shift in the FBG resonant wavelength, known as the Bragg wavelength ($\lambda_B$). This is manifested in the reflected power spectrum. The operation of the FOCS in FIGS. 4a, 4b can be easily explained by considering it as a cascade of two FBGs, i.e. the reflected power spectrum $R_T(\lambda)$ of the FOCS (carrying magnetic field intensity (H) information) is a product of the reflected power spectra ($R_1(\lambda)$ and $R_2(\lambda)$) of 2 FBGs, $FBG_1$ and $FBG_2$. As MONEL 400 and Terfenol-D experience the same thermal strain, they maintain the same Bragg wavelength $\lambda_{B1}$ and grating period $\Lambda_1$. As long as H=0 (as in FIG. 4a), $R_1(\lambda)$ and $R_2(\lambda)$ remain identical and, most importantly, the reflective spectral peak locations of the two FBGs are identical. Consequently, the output of the FOCS, i.e. the area under the $R_T(\lambda)$ curve, is constant and independent of temperature. When H surges with the fault current, Terfenol-D piece elongates and parameters of $FBG_2$ (attached to the piece) change to $L_2$, $\lambda_{B2}$ and $\Lambda_2$. These variations are manifested as a modulation in the reflected power and two distinct peaks in the reflective spectrum of the FOCS. Hence, the FOCS output (the area under the $R_T(\lambda)$ curve) rises proportionally to H (see FIG. 4b) until $R_1(\lambda)$ and $R_2(\lambda)$ are entirely apart.

Figure 4:
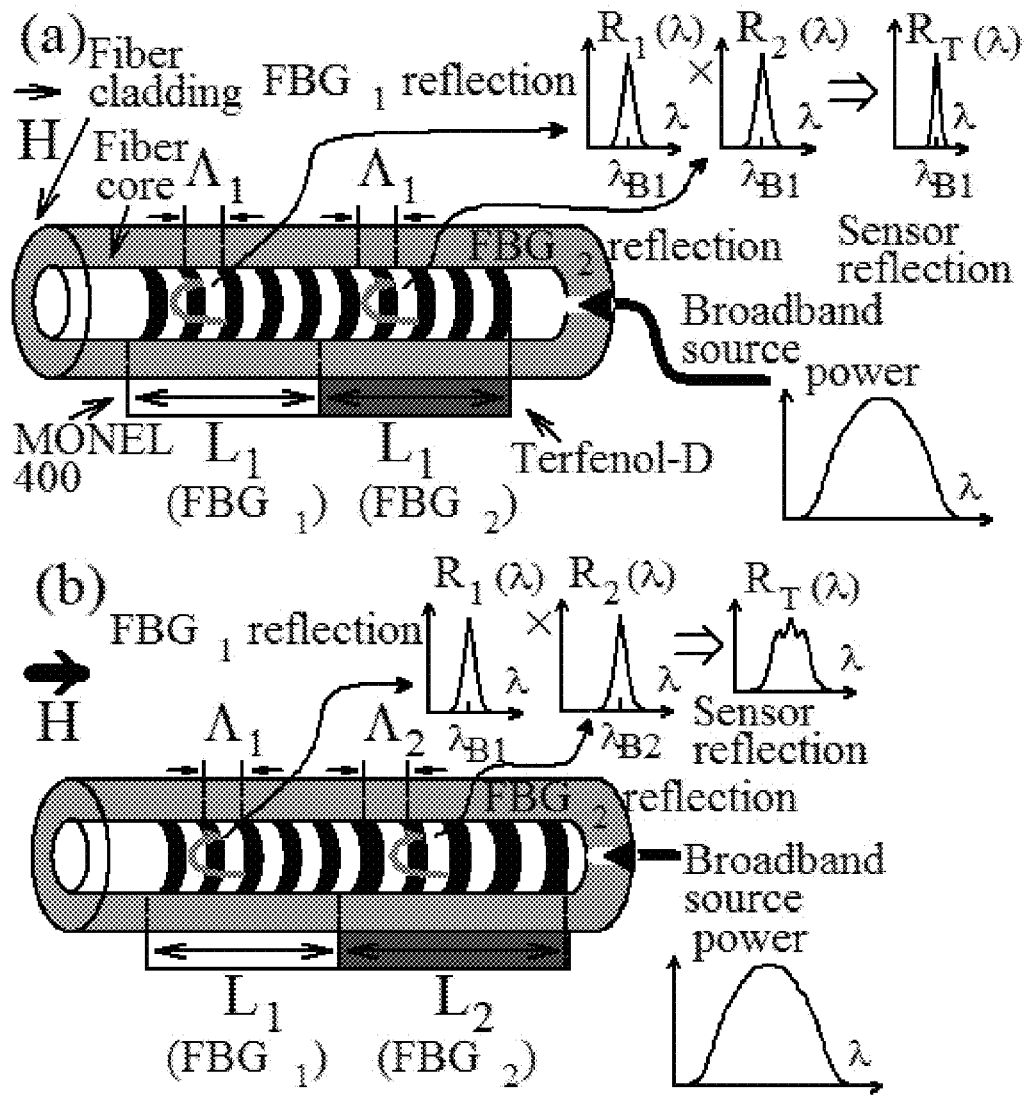
FIG. 4a shows a FOCS response for H=0 and FIG. 4b shows a FOCS response for large H where $FBG_1$ has grating period $\Lambda_1$, length $L_1$ and Bragg wavelength $\lambda_{B1}$ and $FBG_2$ has grating period $\Lambda_2$, length $L_2$ and Bragg wavelength $\lambda_{B2}$.
Figure 5:
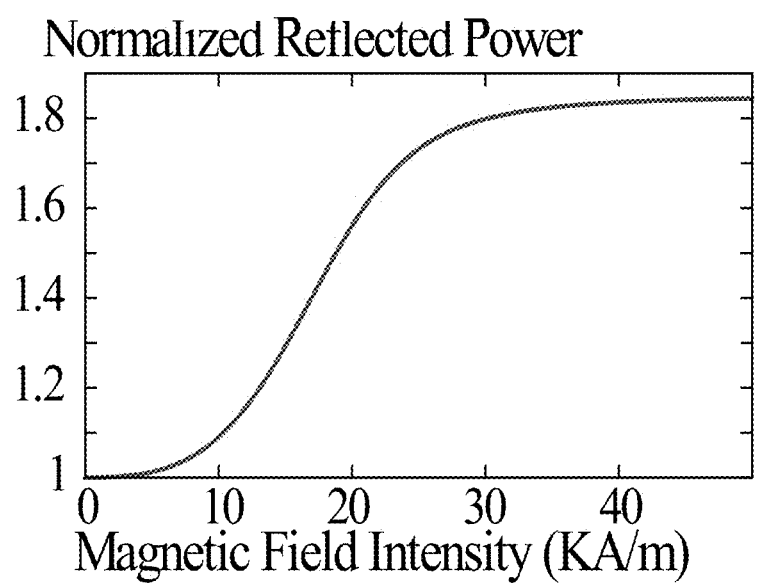
FIG. 5 shows a transfer function of the FOCS of FIGS. 4a and 4b.
Figure 6:
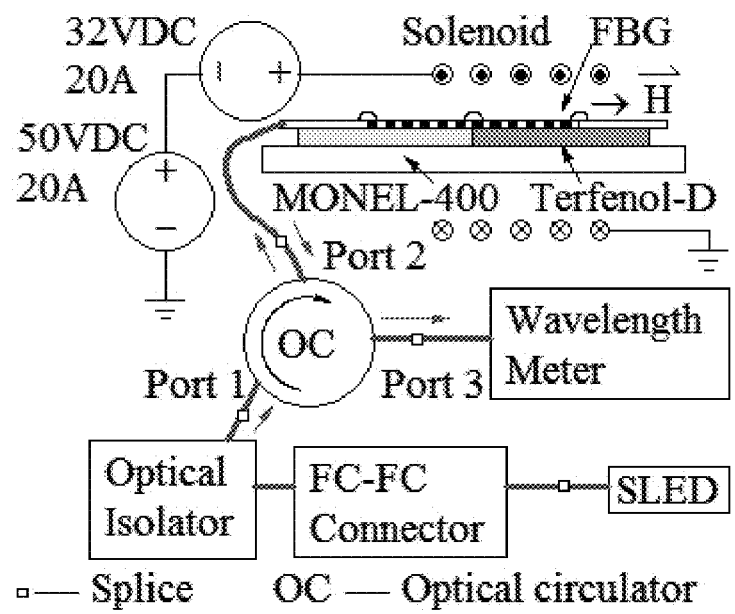
FIG. 6 shows a schematic diagram for a DC measurement setup.
Figure 7:
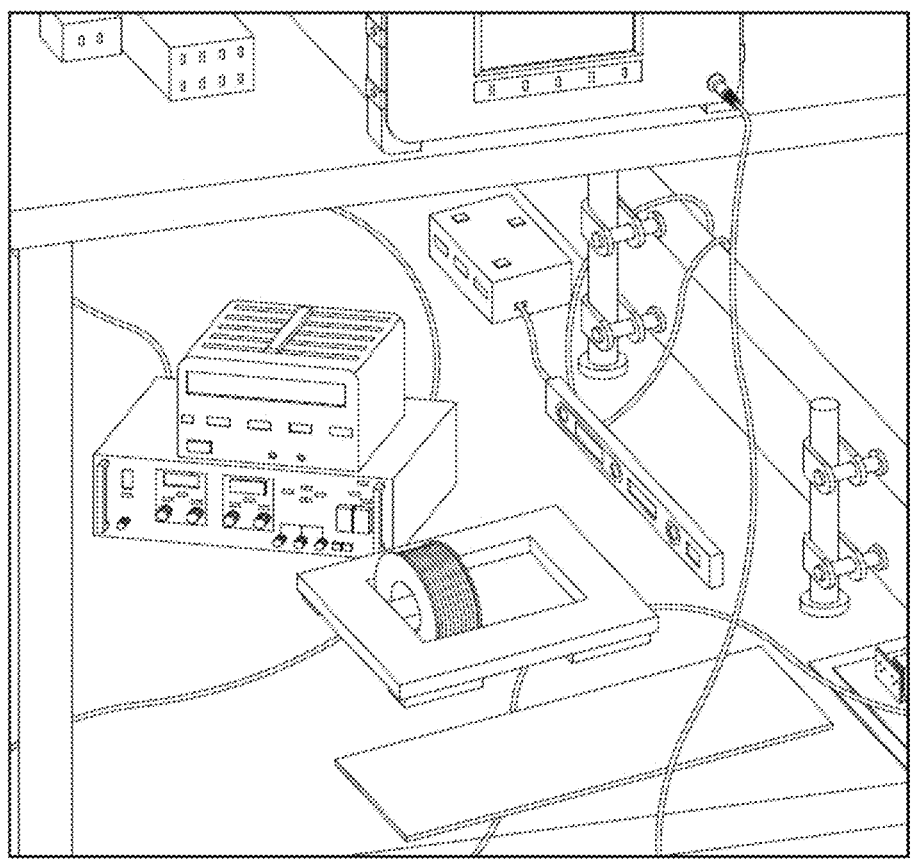
FIG. 7 shows a physical layout for a DC measurement setup.

The transfer function of the FOCS in FIGS. 4a and 4b varies linearly for H between 10 kA/m and 20 kA/m (see FIG. 5), results that have been validated using the setup for DC current measurement shown in FIGS. 6 and 7. A superluminous light emitting diode (SLED) was used as the broadband light that interrogated the FOCS. The SLED outputs infra-red light with a central wavelength of 1547 nm and a line width of 63 nm, which was then passed through an optical isolator, enforcing a unidirectional propagation path. The light subsequently entered port 1 of an optical circulator (OC) and reached the FBG through port 2 of the OC. The FBG returned a narrow band of the SLED light near its Bragg wavelength back to port 2. The returned signal from the FBG (output of FOCS) exited the OC through port 3 and was measured by a wavelength meter. The use of an isolator and OC greatly reduced reflection-related instability and maximized the return signal. The FOCS output spectrum was modulated by the H from a coil connected to two 20 A DC power supplies in series. During experiments, the current level was tuned and the magnetic field H and the FOCS output spectrum were recorded. A similar setup was used for 60 Hz AC measurements using a high current source except that the coil and voltage sources were replaced by a bus bar connected to a 1000 A current source. The response of FOCS was similar to that of a conventional Hall effect sensor, except that the FOCS output was unipolar. In particular, the response of the FOCS to the magnetic field H translated to measurements of current in hundreds to thousands of amperes. By using a magnetic core, the FOCS sensitivity was boosted by at least five fold. It is anticipated that the use of a magnetic core, with optimum design, can provide a gain in sensitivity by a factor of up to fifty fold.

During fabrication of the FOCS disclosed herein, challenges included the brittleness of Terfenol-D and the fragility of FOCS. To extend the application of FOCS to other uses such as accurate electric current measurements for applications such as motor drives, a current sensor with a short response time and wide dynamic range are required. Although Terfenol-D is a giant magnetostrictive material that produces strain on the order of 1000 ppm, its operational frequency is limited to the order of kHz and its brittleness hinders its use of conventional machining methods for device fabrication. Moreover, Terfenol-D is a rather rare and expensive alloy. To address all these issues, Terfenol-D composites were considered. In a composite with Terfenol-D particles surrounded by a nonmetallic binder (such as epoxy resin or other polymers), the flow of eddy current is interrupted among particles by the increased electrical resistivity of the resin. As a result, the heat generation by eddy current losses is reduced and higher operational frequencies can be reached. In principle, Terfenol-D particles have a response time on the order of microseconds under ideal conditions. Another advantage of a Terfenol-D composite is its flexibility in manufacturing and machining. For instance, complex shapes can be produced with mold injection methods. Since the composite has a volume fraction of Terfenol-D less than one, the FOCS based on composite Terfenol-D will incur less material costs. For the same reason, the strain induced by composite Terfenol-D is expected to be less than that of monolithic Terfenol-D. Moreover, the ability of controlling strain distribution by varying the Terfenol-D particle concentration along the magnetic sensing direction provides opportunities for designing a new type of FOCS that may be able to compensate for reductions in the maximum strain associated with the use of composite materials.

Disclosed herein are methods for fabrication of Terfenol-D composites which permit better control of the Terfenol-D particle distribution and which facilitate understanding of interaction between the epoxy and the Terfenol-D particles. FOCSs using these composites are expected to be rugged since the FBG will be embedded inside a polymer or an epoxy. Embedding the FBG inside a block of material allows the FBG to sense the strain distribution inside that material. With careful control and accurate transfer of the strain distribution on the FBG, the FBG period will be regulated accordingly. Such a modulation on the FBG period will introduce frequency chirping to an optical signal, i.e. increase in the bandwidth of the reflected signal. The rise in bandwidth translates into increases in return power. Therefore, the return power can be used to infer the level of magnetic field by converting the return power to a specific magnetic magnitude field level and correlating this to a given strain distribution.

Among other applications, composites of magnetostrictive materials such as Terfenol-D may be used with a FOCS such as that shown in FIGS. 1a and 1b. In particular, composites of Terfenol-D and MONEL 400 may be placed between the support and the tapered block shown in FIGS. 1a and 1b. This arrangement can be used to generate a chirped signal as described above.

Figure 8A:
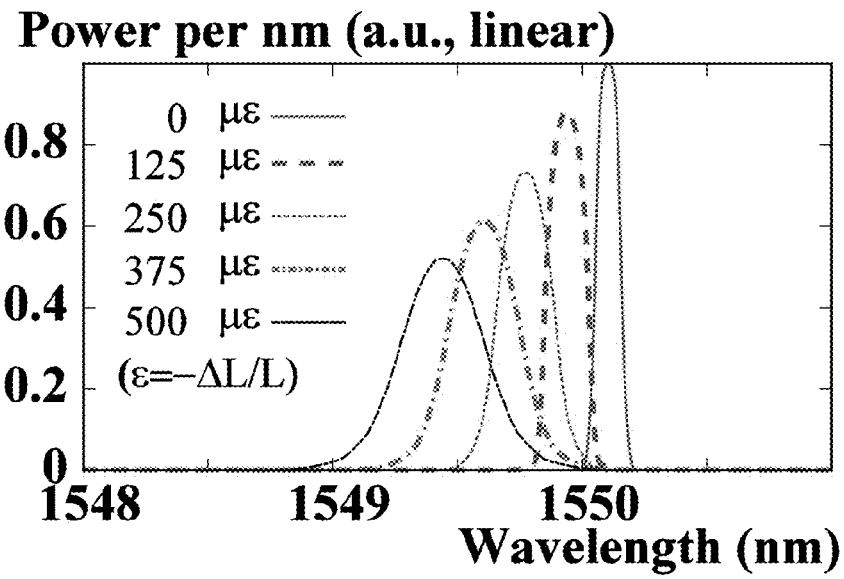
FIG. 8a shows variation of reflected spectra with microstrain (με) in a chirped FOCS.

For simplicity, the response of the chirped FOCS was simulated with a monolithic Terfenol-D transducer rather than a composite. The variation of cross section of the strain distribution converter was designed along the z axis so that FBG period will vary linearly with z and introduce linear chirping for the reflected optical signal, as discussed above. FIG. 8a displays the variation of reflected spectra with maximum strain introduced by the transducer.

Expansion of the Terfenol-D caused by a magnetic field with intensity H, denoted by strain $\epsilon$ (H), compresses the polymer with a uniform strain gradient, introducing a linear chirp in the fiber grating period given by $$\frac{d\lambda_B}{dz} = -\lambda_B L_T \epsilon (H) \left(\frac{L_0^2}{2} + \frac{L_0}{k}\right)^{-1} \quad (1)$$

where $L_T$ is the length of the Terfenol-D, $L_0$ is the length of the tapered section of the polymer, and $\lambda_B$ is the unchirped Bragg wavelength of the grating. In order to model the strain experienced by the Terfenol-D under the influence of a magnetic field, we have used a third-order polynomial approximation to fit experimental data that we have collected using a FBG as a strain gauge by attaching it to a T-D rod at two points.

Numerical simulations are performed to find the reflectance spectrum using two separate methods. Both are based on the "synchronous approximation" to the coupled mode equations describing forward- and backward-propagating modes in the fiber at wavelengths near resonance. The first method involves a numerical fourth-order Runge-Kutta approximation. The second method assumes a piecewise uniform structure for the grating, and the power reflectance at each wavelength is determined by multiplication of a series of transfer matrices. The transfer matrices used in this method are modified to provide a closer approximation of the actual output. Results obtained with the two methods generally agree very well. With these numerical techniques, power spectra of FOCS returned signals under various SDs for certain Hs were obtained.

Figure 8B:
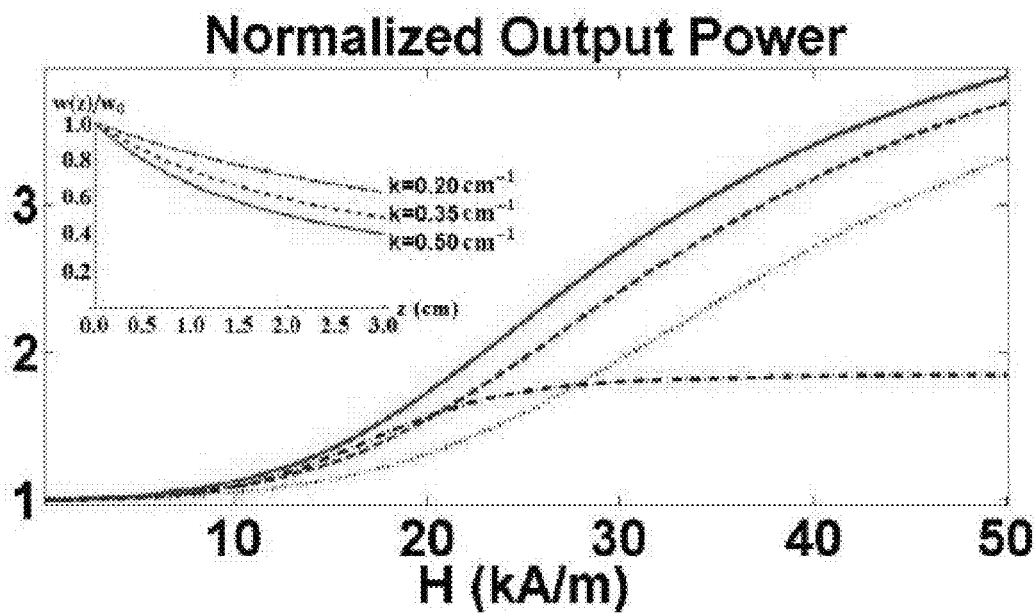
FIG. 8b shows the response of the chirped FOCS. Inset: polymer shape. Black Dotted line: k=0.20 cm$^{-1}$; Green Dashed line: k=0.35 cm$^{-1}$; Red Solid line: k=0.50 cm$^{-1}$; Blue Dash-Dot: known design.

Sensor output as a function of the incident magnetic field is shown in FIG. 8b. Here, values of $n_{eff}$=1.46547, $\lambda_B$=1550 nm, $L_T$=3 cm, and $L_0$=3 cm were used. It can be seen that the sensitivity is improved at lower field values and that there is over a double relative increase in power over the design in FIGS. 4a and 4b. Additionally, the dynamic range is dramatically improved over the original fiber optic current sensor design in FIGS. 4a and 4b, as evidenced by the larger quasi-linear range output range and increased saturation field.

Figure 9:
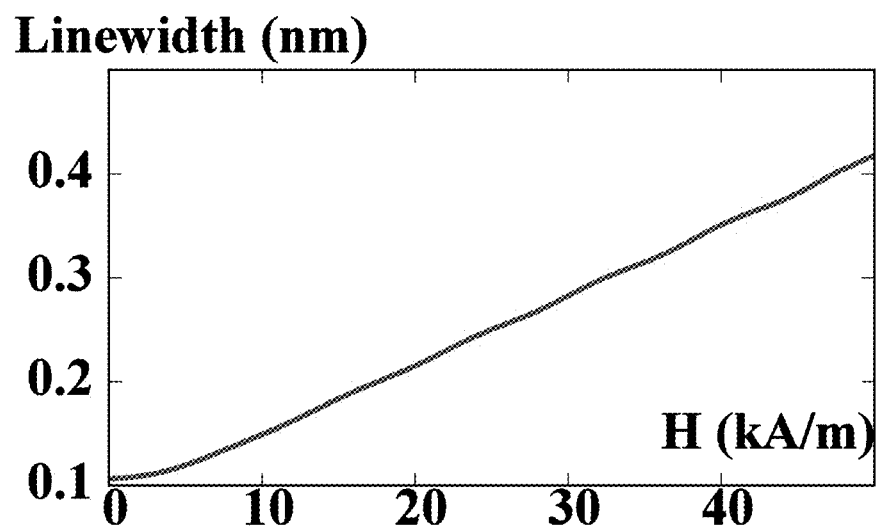
FIG. 9 shows variation of spectral width with magnetic field in a chirped FOCS.
Figure 10:
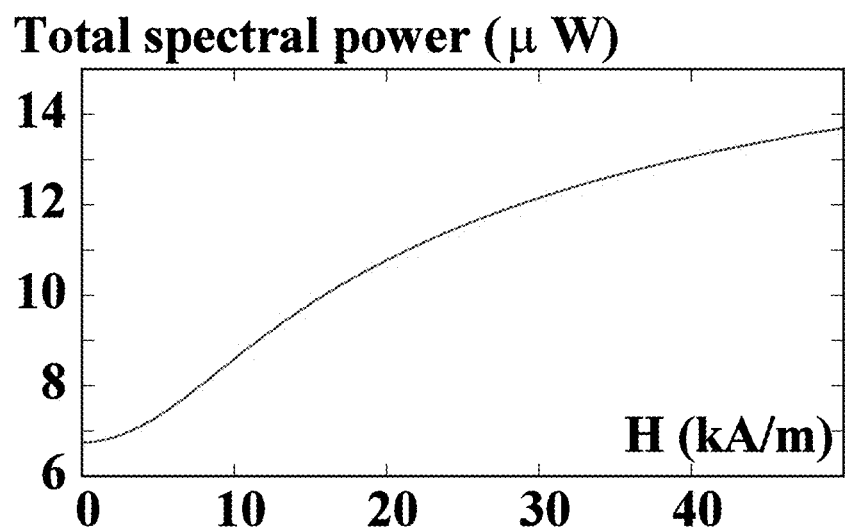
FIG. 10 shows response of the chirped FOCS.

Note that the non-uniform strain distribution causes a fairly steady change in spectral peak and linewidth as strain increases. However, the analysis focuses only on the linewidth since it is immune from the effect of uniform strain induced by other environmental artifacts, such as thermal expansion of the polymer. In fact, FIG. 9 depicts a nearly linear relationship between linewidth and magnetic field. Similarly, FIG. 10 shows the chirped FOCS reflected power as a function of magnetic field. Again, the response is fairly linear with extended dynamic range (compare to FIG. 5) and somewhat enhanced sensitivity.

The structure of the chirped FOCS can be further simplified if it is fabricated as a Terfenol-D composite with graded particle size distribution and/or volume fraction, using particles of Terfenol-D ranging from 20 to 300 microns. In some embodiments, elongated particles up to 1 mm in length may also be used (see FIG. 2). In FIG. 2, areas with larger particles and/or higher volume fractions of magnetostrictive material are indicated using darker grayscale values. Since strain scales up with the higher volume fraction region, the darker regions will have higher strain than the lighter regions. If the strain can be transferred fully to the FBG, a uniform FBG under zero magnetic field (see FIG. 2, left) can be completely transformed into a chirped FBG when the magnetic field is nonzero (see FIG. 2, right).

Figure 11:
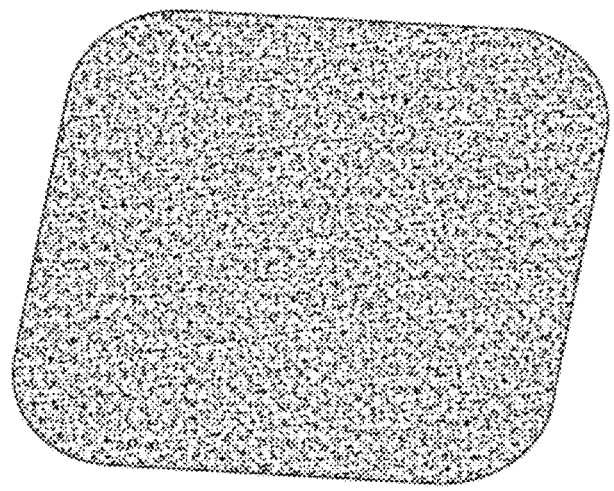
FIG. 11 shows an image of a Terfenol-D composite having a speckle pattern.
Figure 12:
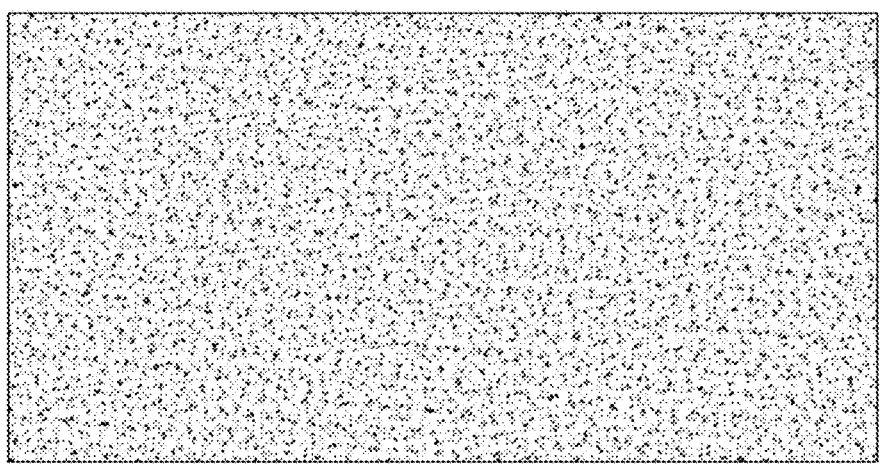
FIG. 12 shows a 400% zoom of the sample of FIG. 11 to better show the speckle pattern.

Specimens were fabricated using a volume fraction $V_f=0.4$ and a dimension of 1"×1"×0.25". The resulting Terfenol-D composite, which has the speckle pattern shown in FIG. 11 and further magnified four times in FIG. 12. Two-dimensional digital image correlation (DIC) was used to capture the strains on the surface of the composite specimen. The DIC technique uses a random speckle pattern applied to the specimen that is captured using a couple-charged device (CCD) camera. These images are then processed using correlation algorithms to compare strained maps to a reference image taken before the loading is applied.

Figure 13:
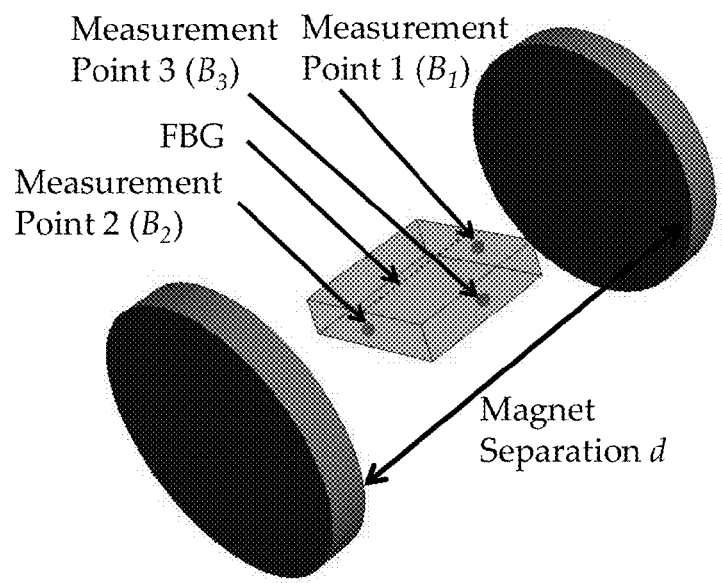
FIG. 13 shows a diagram for experimental setup and measurement points.

Using the DIC method, it was possible to observe strain distribution and creep effect for these samples. Preliminary DIC data (without calibration) indicate that these samples have average strain values of 400 ppm when they were very close to a pair of N52 rare earth magnets. However, to perform a more accurate measurement of average strain for these samples, an FBG was used as a strain gauge by attaching it along the magnetostriction axis at two points and a 12 gauge copper wire was laid across the top of the sample with adhesive tape to prevent it escaping from the holder. The sample with holder was clamped on one arm of a PC board holder and was placed in between two N52 rare earth magnets (1" diameter and 0.5" thick) that were attached at a known spacing apart (using duct tape to the front and back jaws of a bench vice). The distance between the magnets and the sample can be adjusted by moving the jaws of the bench vise and hence, this can be used to control the magnetic field magnitude. Before each measurement, the separation between the magnets was first changed and then the sample was centered between the magnets. After all components were secured and fixed, magnetic field measurements were performed at three locations (see FIG. 13). The reflected power spectrum was recorded from a wavelength meter and the peak power wavelength of the spectrum was also recorded. Magnetic field and power spectrum data were collected for eight magnet separation distances (d's) varying from 66 mm to 37 mm.

Figure 14:
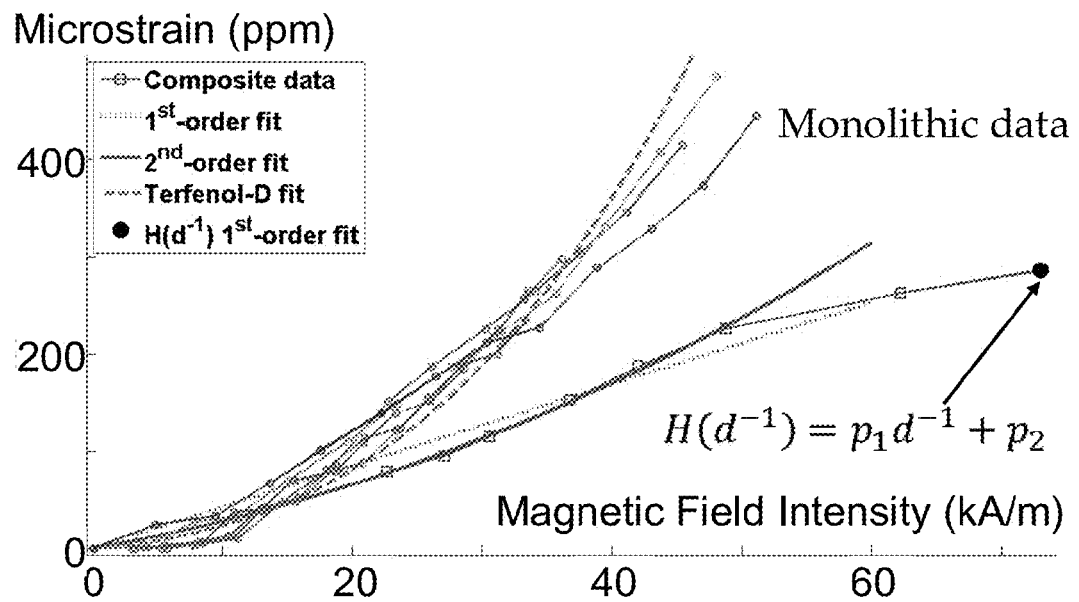
FIG. 14 shows magnetostrictive strain versus magnetic field.

FIG. 14 shows a comparison of the magnetostriction of monolithic Terfenol-D to that of its composite counterpart. Since the composite has $V_f$ less than 1, its sensitivity is expected to be diminished compared to the monolithic material. FIG. 14 confirms the sensitivity dropping to approximately 50% of the monolithic material's values. The reduction in magnetostriction can be attributed to the somewhat random distribution of Terfenol-D particles. As a result, positive strains are localized around regions with clusters of Terfenol-D particles while negative strains are formed in other sites. On average, the strain of the composite will be lower than that of monolithic Terfenol-D.

Fiber optic current sensors generally are compact and simple in construction and immune from EMI and have advantages in measuring high current and flexibility in forming a sensor network. Moreover, they require only simple power measurements without elaborate signal processing for monitoring current. The novel designs disclosed herein using magnetostrictive materials such as Terfenol-D or composites of such materials further enhance the sensor ruggedness, response speed, dynamic range, and sensitivity. In particular, the transverse FOCS configuration allows for easier integration with a magnetic core for sensitivity enhancement than typical FOCS designs. Moreover, this configuration has a facile manufacturing method allowing for fast fabrication of FOCS based on uniform FOCS as well as chirped FOCS.

The invention and its embodiments may be applied to a range of current sensing application including such applications as high current power line sensors and in current detection in motor or other power systems, all while not requiring the sensor to be in direct contact with the conductor(s).

The above-described embodiments may be varied in a number of ways that are within the scope of the original invention.

Several different methods may be used to produce graded composites of magnetostrictive materials and strain distribution converter, whether in a continuous or stepwise gradient. As indicated above, the magnetostrictive material may vary across the gradient by volume fraction and/or particle size. The typical fiber volume fraction ranges will be from 0 to 0.45, although in some embodiments the volume fraction may be as high as 0.65. Sizes of the particles of magnetostrictive materials may range from 20 µm to 300 µm, although in some embodiments elongated (high aspect ratio) particles may be used which range up to 1000 µm (1 mm) in length.

In some embodiments the graded composite may have smaller particles at one end and larger particles at the other end, with a graded range of particle sizes in between. These varying particle sizes may be present in a constant volume fraction across the composite or the volume fraction may increase with increasing particle size. Particles may be sorted by size using sieves with or without the use of centrifugal force to separate the particles by size. The particles may be separated within an epoxy or other polymer such that the particles are cured at the time of separation.

Figure 15:
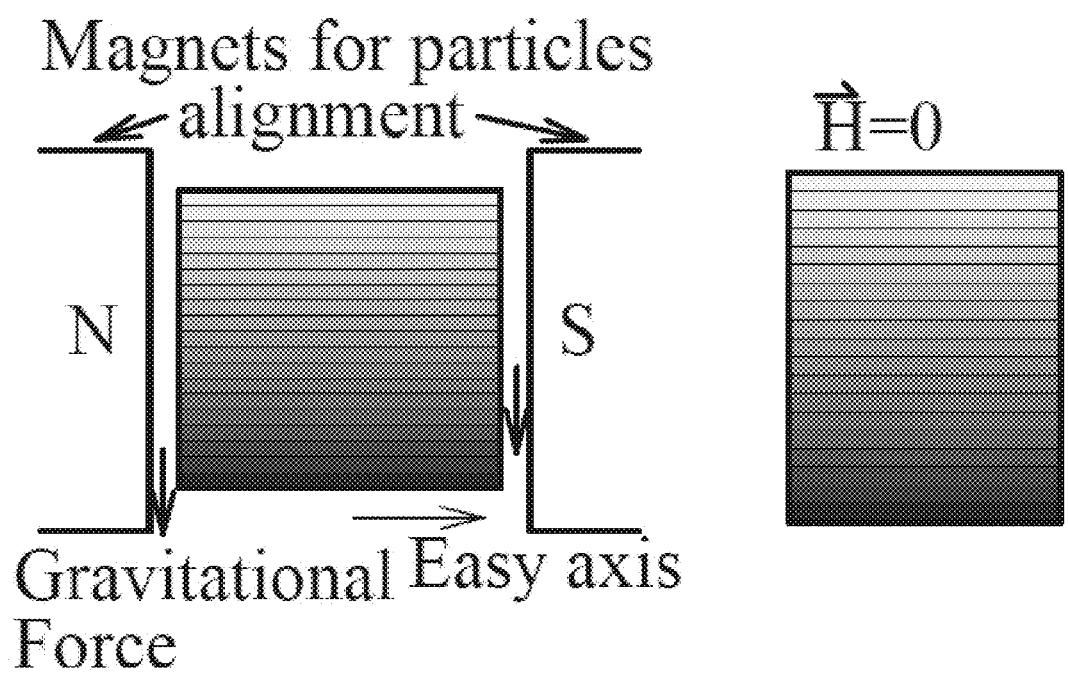
FIG. 15 shows application of a magnetic field during composite fabrication.

While the use of one or more sieves can complicate formation of the composites, on the other hand it guarantees the establishment of multiple zones with distinct particle size and volume fraction at each zone. In some embodiments a magnetic field (H) may be applied to the polymer during separation and curing in order to smooth the stepwise gradient into a more continuous distribution and to produce a more even transition of particle distribution between zones by reducing the effect of gravitational force (FIG. 15).

In some embodiments individual layers of composite material may be fabricated individually, having different volume fractions and/or particle sizes, in order to produce a stepwise gradient. A first layer may be cast and subsequent layers cast onto the first, second, etc. layers, where the composite undergoes several stages of cure after each layer is added. Alternatively, the layers may be cast separately and joined together after casting, for example using adhesive. In some embodiments the FBG may be cast along with the composite while in others an FBG may be sandwiched between two pre-cast composite layers and joined with adhesives or other methods. The sandwich approach will be easier for mold fabrication and allows the FBG to maintain almost uniform period when the magnetic field H=0, since a nonzero magnetic field is used to align particles during composite fabrication and would otherwise introduce magnetostriction during the curing process.

In addition to the methods listed above, continuous gradients may be formed using a controlled segregation approach. In this approach, separation is caused by the force of gravity acting on the difference in density of the powders in the polymer. This can be accomplished through processes such as sedimentation forming, slip casting, centrifugal casting, and thixotropic casting. The volume fraction will be different depending on the location (FIG. 15).

The strain distribution converter (either alone or as part of a composite) may include resilient polymers or epoxy, including various thermosetting and/or thermoplastic materials. While epoxy was used for many of the embodiments disclosed herein, different polymers may be selected with different stiffnesses in order to modulate the behaviors of the final products.

In some embodiment, composites were fabricated using a range of fiber volume fractions, $V_f$=0.3-0.45 and a dimension of 25×25×6 mm using the following procedures. The monolithic Terfenol-D (T-D) bar was crushed into fine powders. The T-D particle range was from 100 to 300 microns. The powder was then poured into a mold and mixed with an epoxy which has a very low viscosity (cps=65) and which allows sufficient powder wetting and void reduction. Care has to be taken with lower volume fractions, as the larger density of the particles will result in stratification. The mixture was degassed under a vacuum for 30 min to eliminate air bubbles. Following this step, the mold with the mixture was placed between a pair of rare earth magnets for alignment of T-D particles along the maximum magnetostriction direction. The whole assembly was placed inside a 70° C. oven for 12 h to ensure full cure of the epoxy.

In general the epoxy should have low viscosity so that all of the bubbles come out when the composite is put inside a vacuum chamber and allowed to cure. Owing to the limitation on packing T-D particles, the maximum $V_f$ is generally limited to 65% (0.65). Typical T-D particle sizes are 100 to 300 microns when T-D particles are produced by crushing. The particle sizes may be as small as 20 microns. Currently, 20 micron to 300 micron particles are available commercially but will require more labor to sort out particles. In various other embodiments $V_f$ may range from 15% to 65% (0.15 to 0.65).

The output of the sensor depends of the ratio of the maximum and minimum $V_f$ in the graded density profile. With $V_f$ from 15% to 65%, this ratio is about 4.3 if particles of the same size are used. The output response can be further enhanced by using smaller particles for the low end (e.g. $V_f$ 15%) and larger particle for the high end ($V_f$ 65%), since the smaller particles have weak magnetostrictive strain.

Figure 16A:
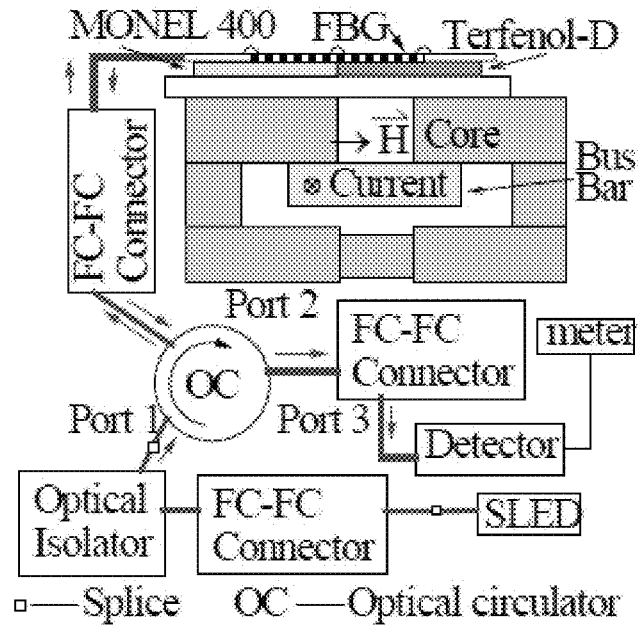
FIG. 16a shows a schematic diagram for a setup for using a FOCS for AC current measurements.
Figure 16B:
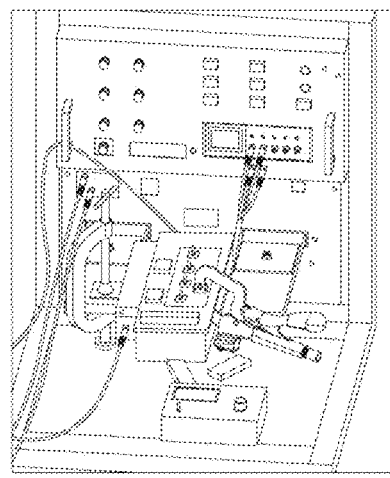
FIGS. 16b and 16c show images of a physical layout for measuring an AC current passing through a bus bar.
Figure 16C:
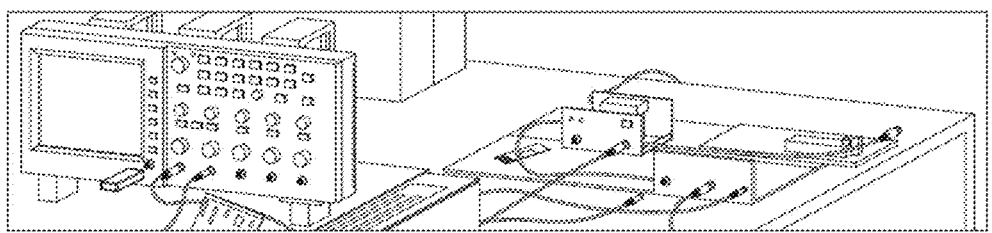
Figure 17:
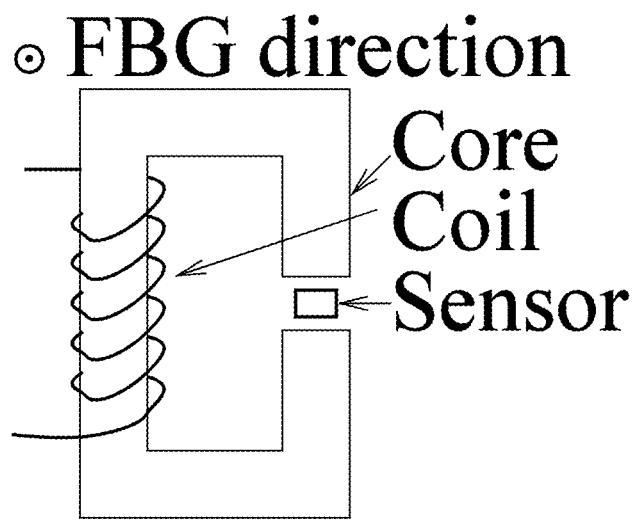
FIG. 17 shows a sensor with a magnetic core.

Another factor to consider is the alignment field which is required to line up particles. However, it will also affect the uniformity of particle distribution. Moreover, gravitational force will limit uniformity. With these considerations, the dimension of the sensor of a graded T-D composite may be up to 2 cm long (generally long enough to cover the full length of a typical FBG), 5-6 mm wide, and 2-3 mm thick. The sensor may be secured at the middle by a holder which lies on the top of a bus bar or conductor (see FIGS. 16a, 16b, and 16c). Another way is to put the sensor in the air gap of a magnetic core (see FIG. 17). This configuration will be good for the transverse configuration of the sensor since the FBG will be not lie across the gap of the magnetic core while the magnetic core will amplify the magnetic field.

Although FBGs are used in most examples herein as a means to measure strain and deformation of the strain distribution converter, in various embodiments other methods may be used, for example optical methods such as the DIC method outlined above in which tracking and image registration techniques, such as digital image correlation and photogrammetry. Alternatively, optical techniques which measure the changes of birefringence in the material such as photoelasticity may be used.

Contact-based methods for measurement can also be used to indicate the strain levels. Examples of such contact methods are those employing extensometers or bonded electrical resistance strain gauges.

Finally, magnetically-induced strains can also be measured using brittle coatings, i.e. polymeric substances designed to fracture at given strain levels. Application of brittle coatings to the surface of the sensor may be used in conjunction with optical techniques to permit direct visual indication if a certain magnetic field is experienced by the magnetostrictive composite material.

Figure 18:
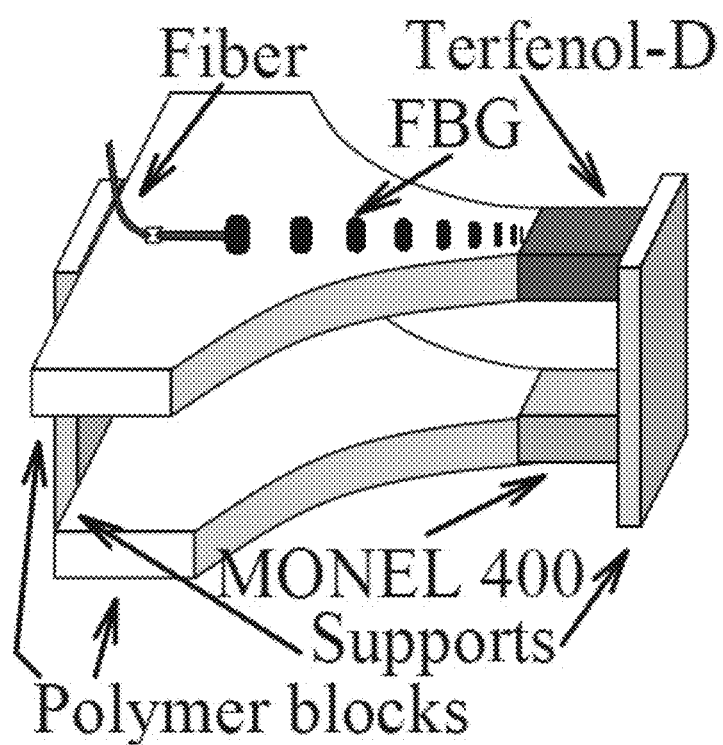
FIG. 18 shows an embodiment of a current sensor as in FIGS. 1a and 1b which is stabilized.
Figure 19:
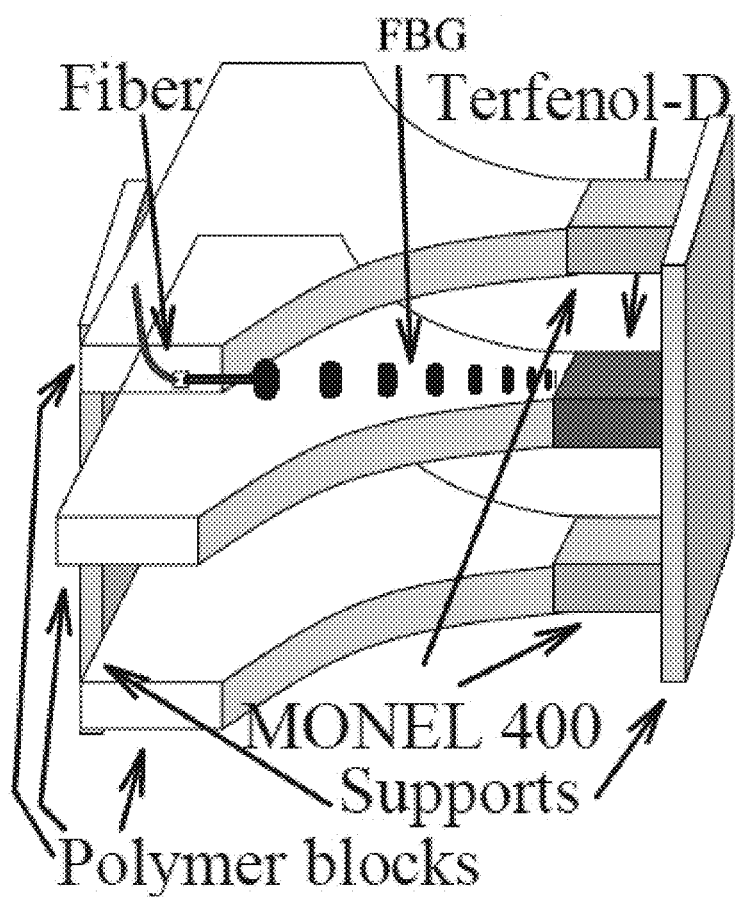
FIG. 19 shows another embodiment of a current sensor as in FIGS. 1a and 1b which is stabilized.

In some embodiments, the tapered strain distribution converter block may be stabilized with one or more blocks in parallel (FIGS. 18, 19). In addition to the strain distribution converter containing the FOCS, one (FIG. 18) or more (FIG. 19) additional tapered strain distribution converters may be attached between a pair of fixed supports. The additional tapered strain distribution converters are held in place by a temperature compensation material (e.g. MONEL 400) having the same coefficient of thermal expansion as the magnetostrictive material to compensate for temperature fluctuations.

Various features and advantages of the invention are set forth in the following claims.

What is claimed is:

1. A current sensor device, comprising:
    a strain distribution converter;
    an optical fiber having a plurality of modulations in refractive index, the plurality of modulations in refractive index being periodic modulations in an initial state without external excitation, and wherein a segment of the optical fiber is coupled with the strain distribution converter; and
    an externally excitable magnetostrictive material associated with the strain distribution converter such that a change in shape of the magnetostrictive material under external excitation causes a change in length of the optical fiber that shifts the plurality of modulations in refractive index into aperiodic modulations,
    wherein the plurality of modulations in refractive index includes a first period, a second period, and a third period, the second period located between the first period and the third period, and
    wherein the first period and the second period are unequal and the second period and the third period are unequal as the length of the optical fiber changes.

2. The current sensor of claim 1, wherein the externally excited magnetostrictive material comprises Terfenol-D.

3. The current sensor of claim 1, wherein the optical fiber is embedded within the strain distribution converter.

4. The current sensor of claim 1, wherein the strain distribution converter comprises epoxy.

5. The current sensor of claim 1, wherein the externally excited magnetostrictive material comprises a rod having a first end and a second end with a long axis there between, wherein the optical fiber has a long axis, and wherein the long axis of the rod of magnetostrictive material is parallel to the long axis of the optical fiber.

6. The current sensor of claim 5, wherein the strain distribution converter comprises a tapered portion having a narrow end opposite a wide end, and wherein the first end of the rod of magnetostrictive material abuts the narrow end of the tapered portion of the strain distribution converter.

7. The current sensor of claim 6, wherein the wide end of the strain distribution converter and the second end of the magnetostrictive material are maintained at a fixed distance relative to one another such that changes in size of the magnetostrictive material along the long axis cause changes in a length of the strain distribution converter between the narrow end and the wide end.

8. The current sensor of claim 7, wherein the length of the strain distribution converter is a first length at a first point in time and a second length at a second point in time, wherein the first length is larger than the second length, wherein the magnetostrictive material has a larger size along the long axis at the second point in time than at the first point in time.

9. The current sensor of claim 8, wherein the strain distribution converter has response profile dependent on strain along the long axis of the strain distribution converter such that a change between the first length and the second length modifies strain along the long axis of the strain distribution converter.

10. The current sensor of claim 9, wherein the change between the first length and the second length results in a decrease in length of the strain distribution converter that is greater at the narrow end.

11. The current sensor of claim 10, further comprising a non-magnetostrictive sleeve surrounding the rod of magnetostrictive material, wherein the non-magnetostrictive sleeve comprises a material having a similar coefficient of thermal expansion as the magnetostrictive material.

12. The current sensor of claim 7, wherein the wide end of the strain distribution converter and the second end of the magnetostrictive material are maintained at a fixed distance relative to one another by a pair of supports.

13. The current sensor of claim 12, further comprising
a second tapered strain distribution converter having a narrow end and a wide end, the wide end of the second tapered strain distribution converter attached to one of the pair of supports, and
a second rod comprising a non-magnetostrictive material having a similar coefficient of thermal expansion as the magnetostrictive material, the second rod having a first end and a second end, the first end of the second rod attached to the narrow end of the second tapered strain distribution converter and the second end of the second rod attached to the other of the pair of supports.

14. The current sensor of claim 1, wherein the externally excited magnetostrictive material is embedded within the strain distribution converter.

15. The current sensor of claim 14, wherein the strain distribution converter comprises
a first end opposite a second end, and
a gradation of magnetostrictive material between the first end and the second end.

16. The current sensor of claim 15, wherein the gradation of magnetostrictive material comprises a continuous gradient.

17. The current sensor of claim 15, wherein the gradation of magnetostrictive material comprises a stepwise gradient.

18. The current sensor of claim 15, wherein the gradation of magnetostrictive material comprises a gradation of particle sizes ranging in size from about 20 micrometers to about 300 micrometers.

19. The current sensor of claim 15, wherein the gradation of magnetostrictive material comprises a range of volume fractions.

20. The current sensor of claim 15, wherein the first end of the strain distribution converter comprises a greater amount of magnetostrictive material than the second end of the strain distribution converter.

21. The current sensor of claim 15, further comprising a magnetic core having an air gap, wherein the strain distribution converter is disposed within the air gap of the magnetic core.

22. The current sensor of claim 1, wherein the optical fiber comprises a fiber Bragg grating, wherein the first period reflects optical signals at a first wavelength, the second period reflects optical signals at a second wavelength, and the third period reflects optical signals at a third wavelength,
wherein the first wavelength, the second wavelength, and the third wavelength are equal when the plurality of modulations in refractive index are periodic modulations in the initial state, and,
wherein the first wavelength, the second wavelength, and the third wavelength are different when the magnetostrictive material is under external excitation and the plurality of modulations in refractive index are aperiodic modulations.

23. A current sensor device, comprising:
a strain distribution converter;
an optical fiber that is coupled with the strain distribution converter and that has a plurality of modulations in refractive index, the plurality of modulations in refractive index being periodic modulations in an initial state without external excitation; and
an externally excitable magnetostrictive material associated with the strain distribution converter such that a change in shape of the magnetostrictive material under external excitation causes a change in shape of the strain distribution converter that shifts the plurality of modulations in refractive index into aperiodic modulations,
wherein the plurality of modulations in refractive index includes a first period, a second period, and a third period, the second period located between the first period and the third period, and
wherein the first period and the second period are unequal and the second period and the third period are unequal as the length of the optical fiber changes.

24. The current sensor of claim 23, wherein the strain distribution converter comprises a composite comprising the externally excited magnetostrictive material.

25. The current sensor of claim 24, wherein the composite has a speckle pattern.

26. The current sensor of claim 25, further comprising a camera for collecting a plurality of images of the speckle pattern.

27. The current sensor of claim 26, further comprising an electronic processor coupled to the camera to receive the plurality of images and configured to analyze the plurality of images using a correlation algorithm to identify a change in shape of the strain distribution converter.

* * * * *